United States Patent
Hsieh et al.

(10) Patent No.: US 10,714,530 B2
(45) Date of Patent: Jul. 14, 2020

(54) IMAGE SENSOR

(71) Applicant: HIMAX TECHNOLOGIES LIMITED, Tainan (TW)

(72) Inventors: Yu-Jui Hsieh, Tainan (TW); Po-Nan Chen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 54 days.

(21) Appl. No.: 15/261,872

(22) Filed: Sep. 10, 2016

(65) Prior Publication Data
US 2018/0076253 A1 Mar. 15, 2018

(51) Int. Cl.
*H01L 27/14* (2006.01)
*H01L 27/146* (2006.01)

(52) U.S. Cl.
CPC .... *H01L 27/14649* (2013.01); *H01L 27/1462* (2013.01); *H01L 27/14621* (2013.01); *H01L 27/14627* (2013.01); *H01L 27/14632* (2013.01)

(58) Field of Classification Search
CPC ........... H01L 27/14649; H01L 27/1462; H01L 27/14621; H01L 27/14627; H01L 27/14632; H01L 27/01
See application file for complete search history.

(56) References Cited

U.S. PATENT DOCUMENTS

| 2003/0103267 | A1* | 6/2003 | Kasahara | G02B 9/34 359/680 |
| 2006/0145197 | A1* | 7/2006 | Baek | H01L 27/14621 257/222 |
| 2006/0256428 | A1* | 11/2006 | Kochergin | G02B 5/207 359/350 |
| 2007/0102621 | A1* | 5/2007 | Kim | H01L 27/14685 250/208.1 |
| 2008/0131992 | A1 | 6/2008 | Ma et al. | |
| 2011/0193147 | A1* | 8/2011 | Ahn | H01L 27/1461 257/292 |
| 2011/0310472 | A1* | 12/2011 | Hirai | C23C 14/081 359/359 |
| 2012/0056073 | A1* | 3/2012 | Ahn | H01L 27/14609 250/208.1 |
| 2015/0311239 | A1 | 10/2015 | Won et al. | |

(Continued)

FOREIGN PATENT DOCUMENTS

| CN | 1819248 A | 8/2006 |
| CN | 204887163 U | 12/2015 |

(Continued)

*Primary Examiner* — Charles D Garber
*Assistant Examiner* — S M Sohel Imtiaz
(74) *Attorney, Agent, or Firm* — CKC & Partners Co., LLC

(57) ABSTRACT

An image sensor is provided. The image sensor includes a visible light receiving portion and an infrared receiving portion. The visible light receiving portion is configured to receive a visible light. The infrared receiving portion is configured to receive infrared. The visible light receiving portion includes an infrared cutoff filter ball layer configured to collect the visible light. In some embodiments of the present invention, the infrared receiving portion includes a micro-lens layer configured to collect the infrared. In some other embodiments of the present invention, the infrared receiving portion includes an infrared pass filter ball layer configured to collect the infrared.

17 Claims, 17 Drawing Sheets

(56) References Cited

U.S. PATENT DOCUMENTS

| | | | | |
|---|---|---|---|---|
| 2015/0340391 A1* | 11/2015 | Webster | ............ | H01L 27/14605 |
| | | | | 348/322 |
| 2015/0381907 A1* | 12/2015 | Boettiger | ............... | H04N 5/332 |
| | | | | 348/164 |
| 2016/0080669 A1* | 3/2016 | Chou | ................ | H01L 27/14645 |
| | | | | 348/273 |
| 2016/0099271 A1* | 4/2016 | Chou | ................... | H04N 5/2257 |
| | | | | 348/164 |
| 2018/0090657 A1* | 3/2018 | Fei | ............................ | G01J 5/12 |

FOREIGN PATENT DOCUMENTS

| | | |
|---|---|---|
| TW | I370542 B | 8/2012 |
| TW | 201627461 A | 8/2016 |

\* cited by examiner

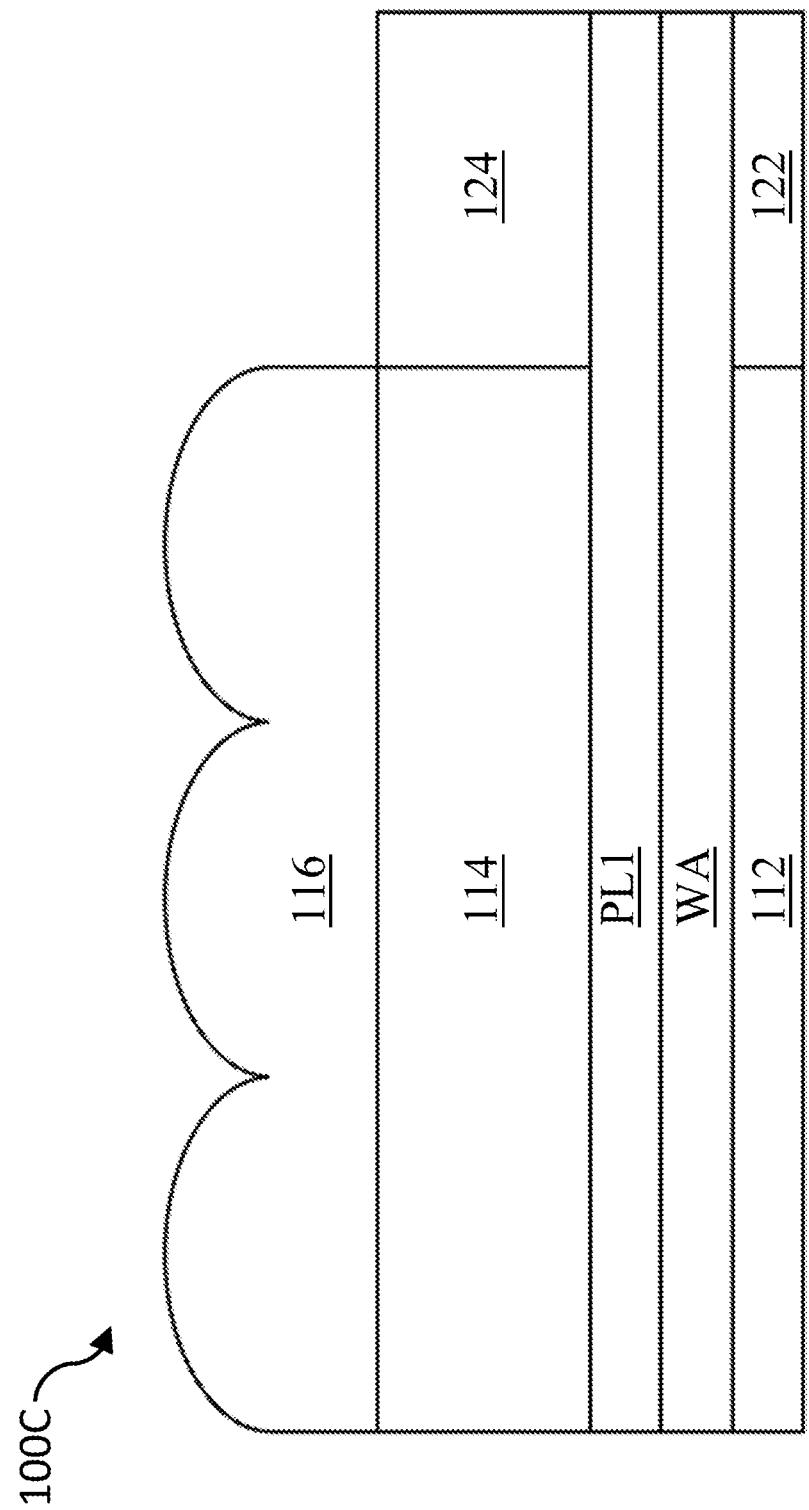

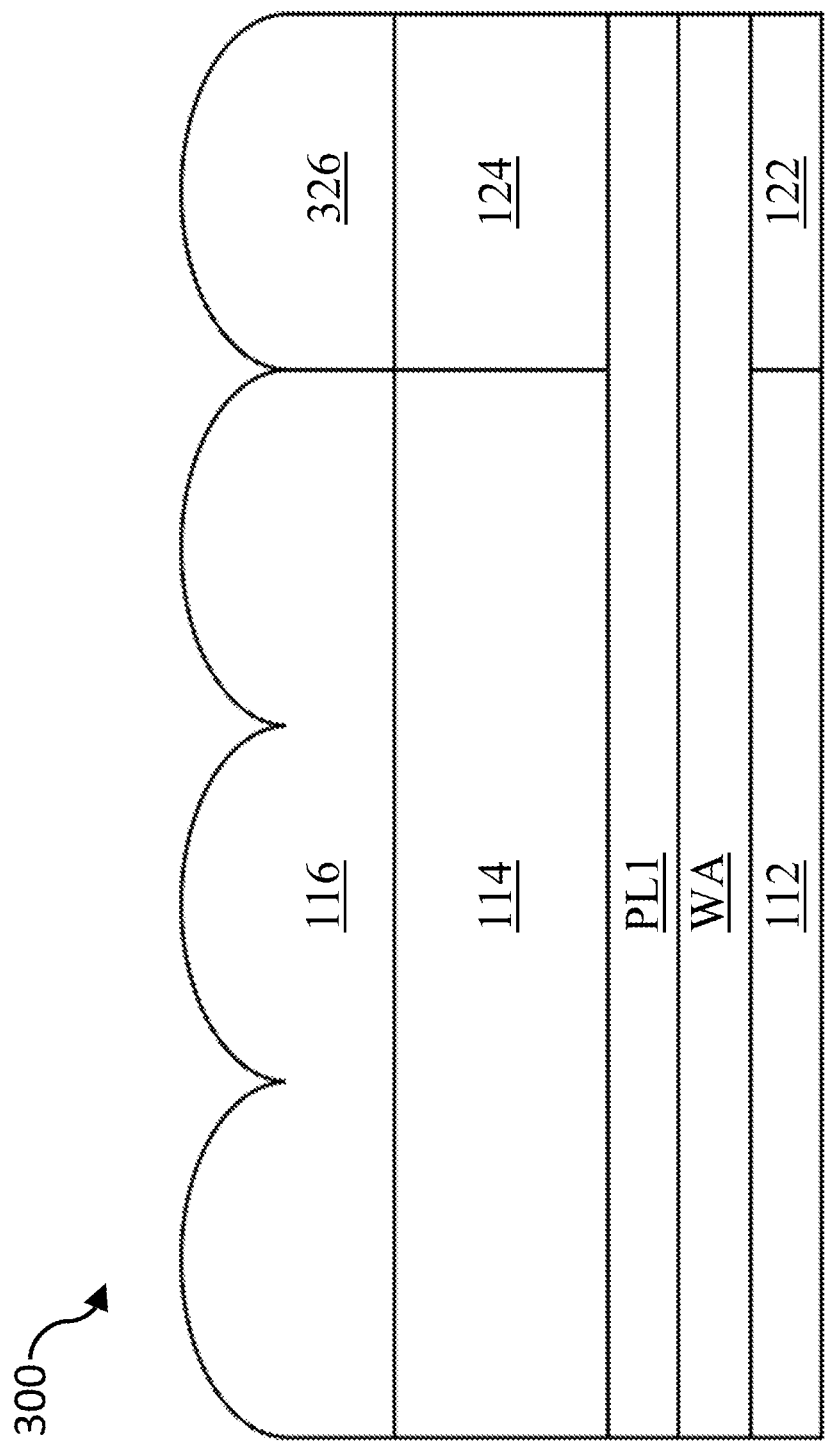

IMAGE SENSOR

BACKGROUND

Field of Invention

The present invention relates to an image sensor. More particularly, the present invention relates to an image sensor having infrared sensing function.

Description of Related Art

With the development of the access control systems and security systems, the biometric technologies using human characteristics to confirm personal identity becomes prevalent. Iris recognition technology is a popular one of the biometric technologies since the iris recognition technology has high reliability. When the iris recognition technology is applied in an electronic device, such as a smart phone, an image sensor capable of receiving visible light and infrared separately is required to implement iris recognition function. A conventional image sensor has two different portions for receiving visible light and infrared separately.

SUMMARY

The present invention provides an image sensor. The image sensor includes a visible light receiving portion and an infrared receiving portion. The visible light receiving portion is configured to receive a visible light. The infrared receiving portion is configured to receive infrared. The visible light receiving portion includes an infrared cutoff filter ball layer configured to collect the visible light. In some embodiments of the present invention, the infrared receiving portion includes a micro-lens layer configured to collect the infrared. In some other embodiments of the present invention, the infrared receiving portion includes an infrared pass filter ball layer configured to collect the infrared.

BRIEF DESCRIPTION OF THE DRAWINGS

The invention can be more fully understood by reading the following detailed description of the embodiment, with reference made to the accompanying drawings as follows:

FIGS. 8a-8g are cross-sectional views of the image sensor corresponding to the steps of the method for forming the image sensor in accordance with the third embodiment of the present invention.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1:
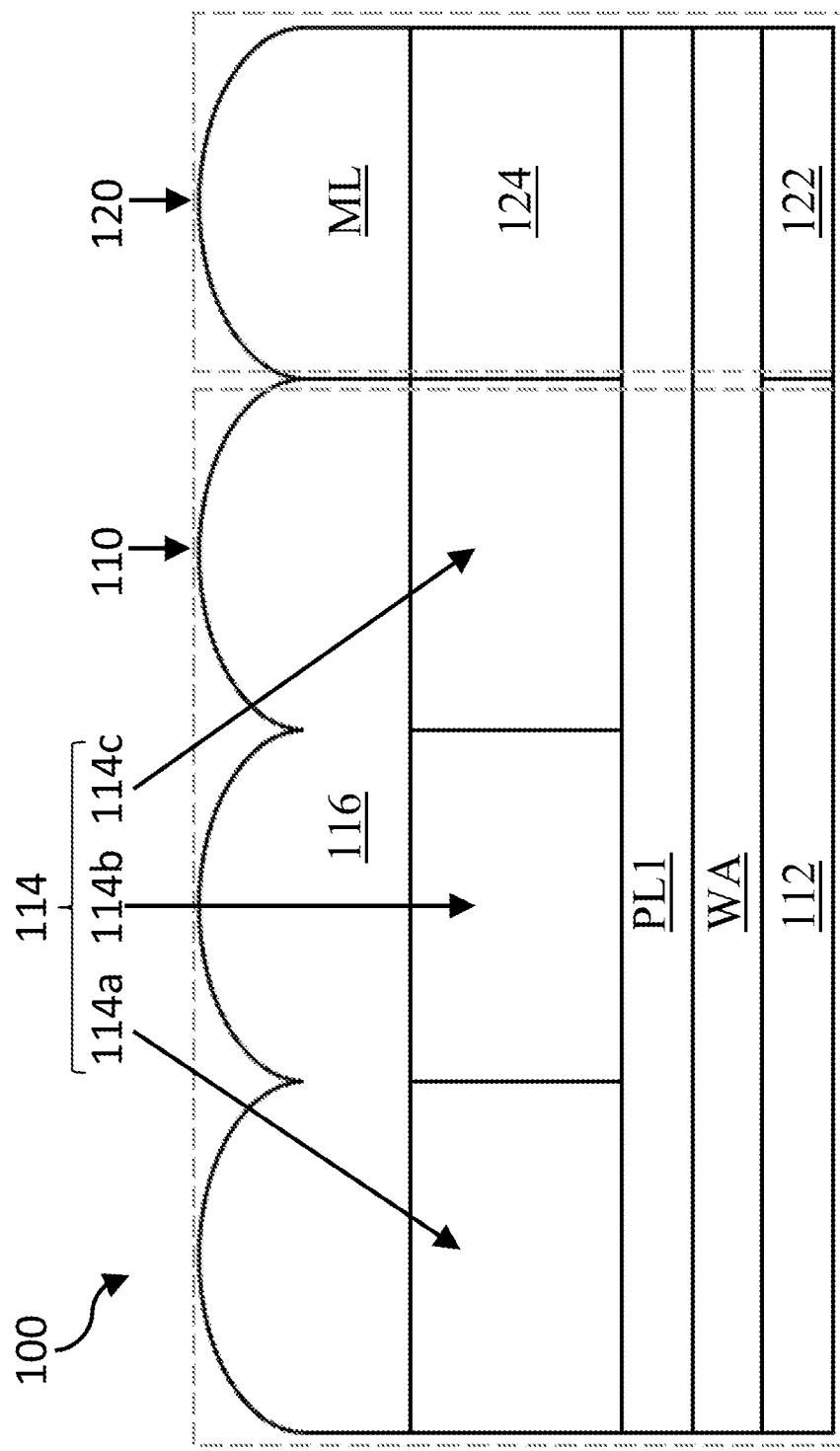
FIG. 1 is a cross-sectional view of an image sensor according to a first embodiment of the present invention.

FIG. 1 is a cross-sectional view of an image sensor 100 according to a first embodiment of the present invention. As shown in FIG. 1, the image sensor 100 includes a visible light receiving portion 110 and an infrared receiving portion 120. The visible light receiving portion 110 is configured to receive a visible light, and the infrared receiving portion 120 is configured to receive infrared.

As shown in FIG. 1, the visible light receiving portion 110 includes a visible light sensing layer 112, a color filter 114 and an infrared cutoff filter ball layer 116. The infrared cutoff filter ball layer 116 is disposed on the color filter 114 and the color filter 114 is disposed on the visible light sensing layer 112 to provide color light to the visible light sensing layer 112, and the visible light sensing layer 112 is configured to receive the visible light to generate main image signals accordingly. In this embodiment, the visible light sensing layer 112 includes at least one photodiode for sensing the color light, and the photodiode may be a complementary metal oxide semiconductor (CMOS) diode. However, embodiments of the present invention are not limited thereto.

The color filter 114 is configured to provide the color light. In this embodiment, the color filter 114 includes a red color filter unit 114a, a blue color filter unit 114b and a green color filter unit 114c, but embodiments of the present invention are not limited thereto.

The infrared cutoff filter ball layer 116 is formed on the color filter 114 to collect the visible light and to cutoff the infrared. In other words, the infrared cutoff filter ball layer 116 can block the transmission of the infrared, while passing the light. In this embodiment, the infrared cutoff filter ball layer 116 blocks lights having a wavelength greater than 850 nm, but embodiments of the present invention are not limited thereto.

As shown in FIG. 1, the infrared receiving portion 120 includes an infrared sensing layer 122, an infrared pass filter 124 and a micro-lens layer ML. The micro-lens layer ML is disposed on the infrared pass filter 124 and the infrared pass filter 124 is disposed on the infrared sensing layer 122 to provide the infrared to the infrared sensing layer 122, and the infrared sensing layer 122 is configured to receive the infrared to generate auxiliary image signals accordingly. In this embodiment, the infrared sensing layer 122 includes at least one photodiode for sensing the infrared, and the photodiode may be a CMOS diode. However, embodiments of the present invention are not limited thereto.

The infrared pass filter 124 is configured to cutoff the visible light. In other words, the infrared pass filter 124 can block the transmission of the visible light, while passing the light. In this embodiment, the infrared pass filter 124 blocks lights having a wavelength smaller than 850 nm, but embodiments of the present invention are not limited thereto.

The micro-lens layer ML is formed on the infrared pass filter 124 to collect the infrared. Specifically, when the image sensor 100 is used to sense an object (for example iris), the object is focused though the infrared cutoff filter ball layer 116 and the micro-lens layer ML. Further, focus of the image sensor 100 can be adjusted by varying a thickness of the micro-lens layer ML and a thickness of the infrared cutoff filter ball layer 116. It is noted that the thickness of the micro-lens layer ML is substantially equal to that of the infrared cutoff filter ball layer 116 in this embodiment, but embodiments of the present invention are not limited thereto.

It is noted that the material of the micro-lens layer ML may be epoxy, optical cement, polymethylmethacrylates (PMMAs), polyurethanes (PUs), polydimethylsiloxane (PDMS), or other thermal curing or photo-curing transparent materials, but the present invention is not limited thereto.

As shown in FIG. 1, the visible light receiving portion 110 and the infrared receiving portion 120 further include a wafer WA and a planarization layer PL1. The wafer WA is formed on the visible light sensing layer 112 and the infrared sensing layer 122 to provide a substrate on which the planarization layer PL1 is formed. In this embodiment, the wafer WA is a glass wafer, but embodiments of the present invention are not limited thereto.

The planarization layer PL1 is used to provide a flat surface on which the color filter 114 and the infrared pass filter 124 are disposed. The planarization layer PL1 also provides a good interface to help the color filter 114 and the infrared pass filter 124 to be attached on the planarization layer PL1. It is noted that a thickness of the color filter 114 is substantially equal to that of the infrared pass filter 124 in this embodiment.

The light path of the infrared received by the infrared sensing layer 122 extends from the micro-lens layer ML through the infrared pass filter 124 and the planarization layer PL1. In comparison with the conventional image sensor, the infrared received by the image sensor 100 has a smaller loss of intensity since a decrease of the light path of the infrared. Therefore, the infrared received by the image sensor 100 has a better intensity to meet a user's demand.

Figure 2:
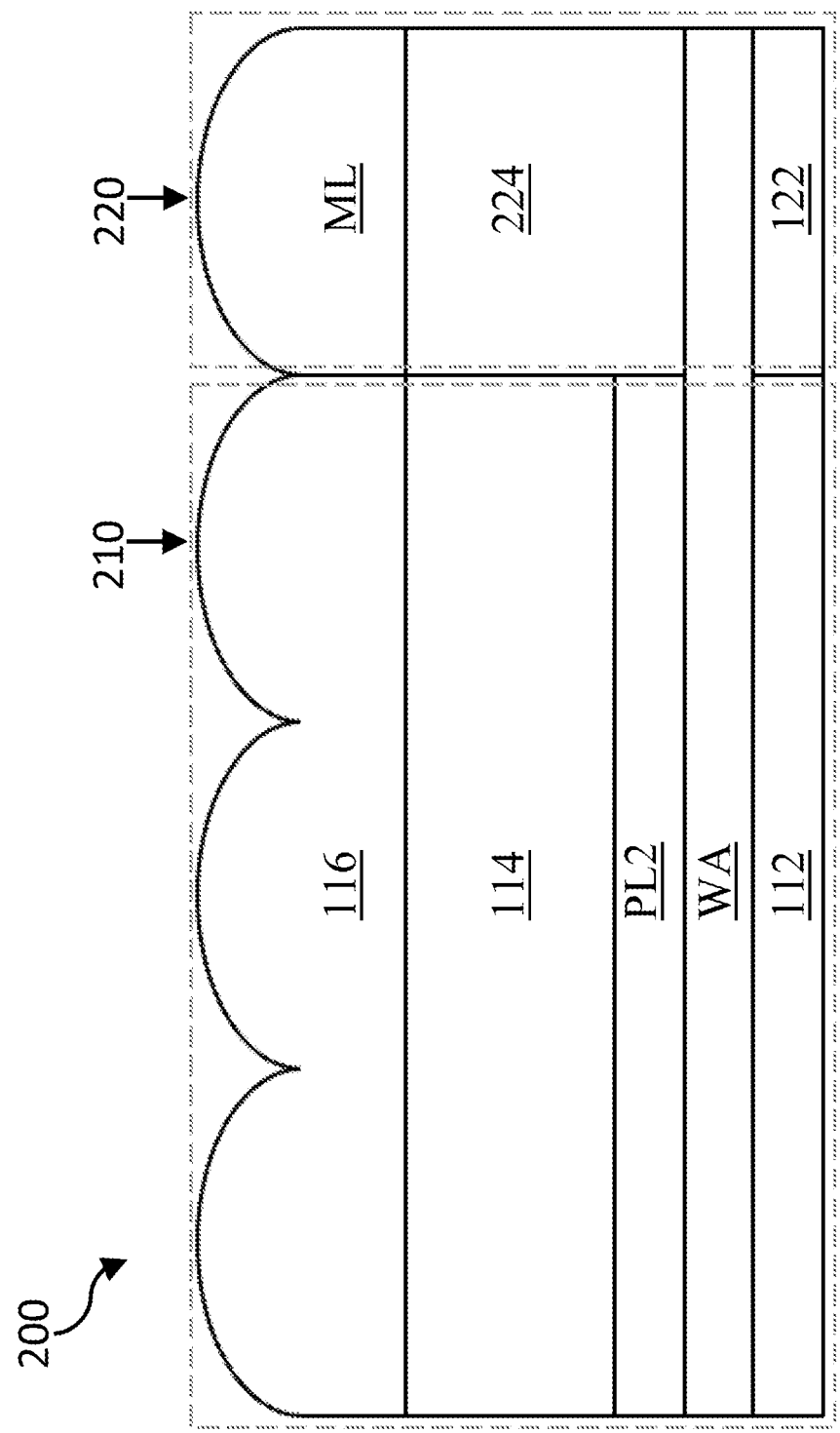
FIG. 2 is a cross-sectional view of an image sensor according to a second embodiment of the present invention.

FIG. 2 is a cross-sectional view of an image sensor 200 according to a second embodiment of the present invention. The image sensor 200 includes a visible light receiving portion 210 and an infrared receiving portion 220, in which the visible light receiving portion 210 includes a planarization layer PL2 and the infrared receiving portion 220 includes an infrared pass filter 224. It is noted that the planarization layer PL2 and the infrared pass filter 224 are similar to the planarization layer PL1 and the infrared pass filter 124 respectively. The structure of the image sensor 200 is similar to the structure of the image sensor 100 except that the planarization layer PL2 is only located in the visible light receiving portion 210. It is noted that a sum of a thickness of the color filter 114 and a thickness of the planarization layer PL2 is substantially equal to a thickness of the infrared pass filter 224 in this embodiment. Similar to the image sensor 100, the infrared received by the image sensor 200 has a better intensity to meet a user's demand.

Figure 3:
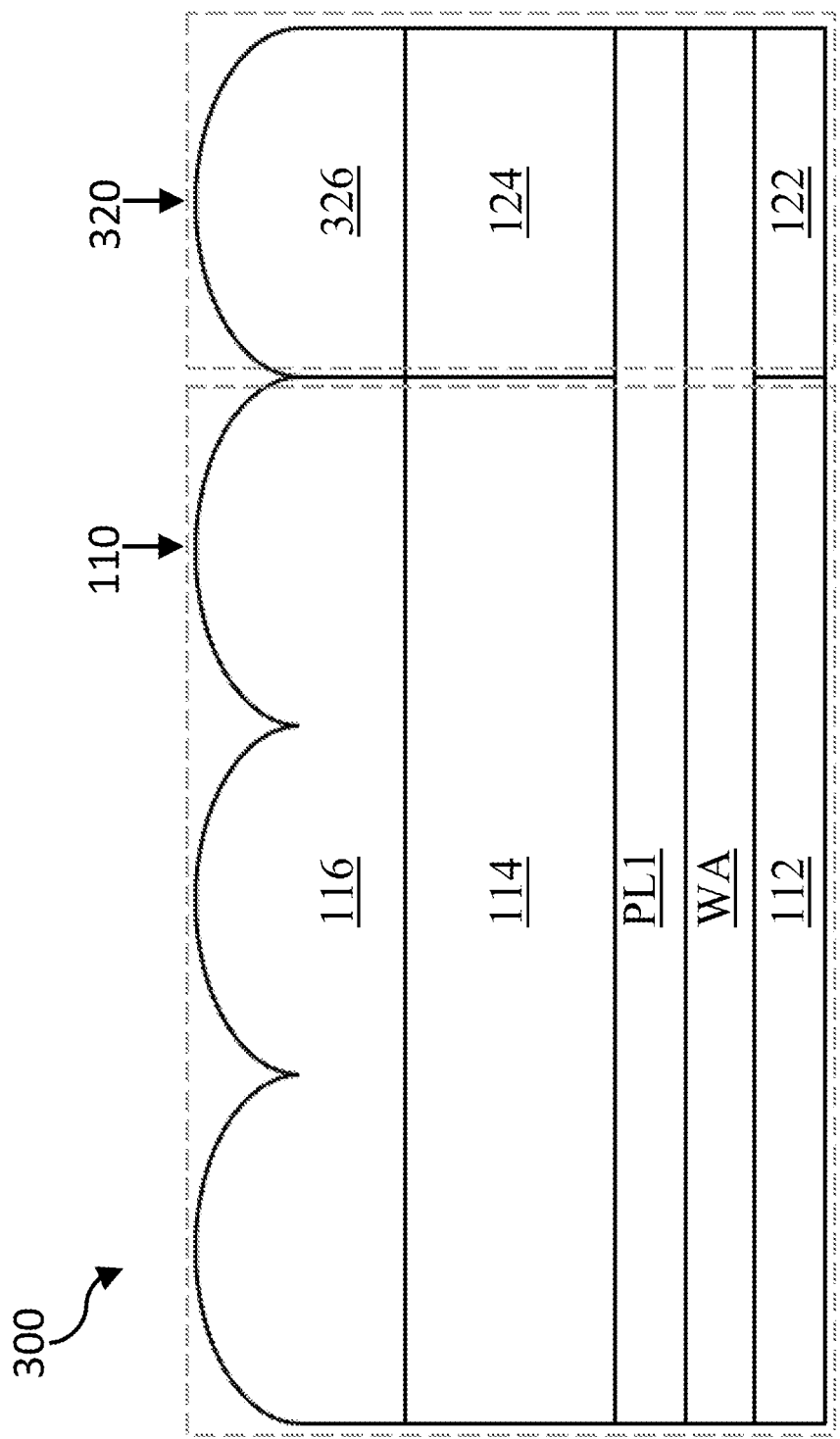
FIG. 3 is a cross-sectional view of an image sensor according to a third embodiment of the present invention.

FIG. 3 is a cross-sectional view of an image sensor 300 according to a third embodiment of the present invention. The image sensor 300 includes the visible light receiving portion 110 and an infrared receiving portion 320, in which the infrared receiving portion 320 includes an infrared pass filter ball layer 326. The structure of the image sensor 300 is similar to the structure of the image sensor 100 except that the micro-lens layer ML is replaced with the infrared pass filter ball layer 326.

The infrared pass filter ball layer 326 is formed on the infrared pass filter 124 to collect the infrared and to cutoff the visible light. In other words, the infrared pass filter ball layer 326 can block the transmission of the visible light, while passing the light. In this embodiment, the infrared pass filter ball layer 326 blocks lights having a wavelength smaller than 850 nm, but embodiments of the present invention are not limited thereto.

Specifically, when the image sensor 300 is used to sense an object (for example iris), the object is focused though the infrared cutoff filter ball layer 116 and the infrared pass filter ball layer 326. Further, focus of the image sensor 300 can be adjusted by varying a thickness of the infrared pass filter ball layer 326 and a thickness of the infrared cutoff filter ball layer 116. It is noted that the thickness of the infrared pass filter ball layer 326 is substantially equal to that of the infrared cutoff filter ball layer 116 in this embodiment, but embodiments of the present invention are not limited thereto.

The light path of the infrared received by the infrared photodiode 122 extends from the infrared pass filter ball layer 326 through the infrared pass filter 124 and the planarization layer PL1. Similar to the image sensor 100, the infrared received by the image sensor 300 has a better intensity to meet a user's demand.

It is noted that the infrared pass filter 124 can be replaced by a white photoresist to decrease intensity loss of the infrared in other embodiments of the present invention.

Figure 4:
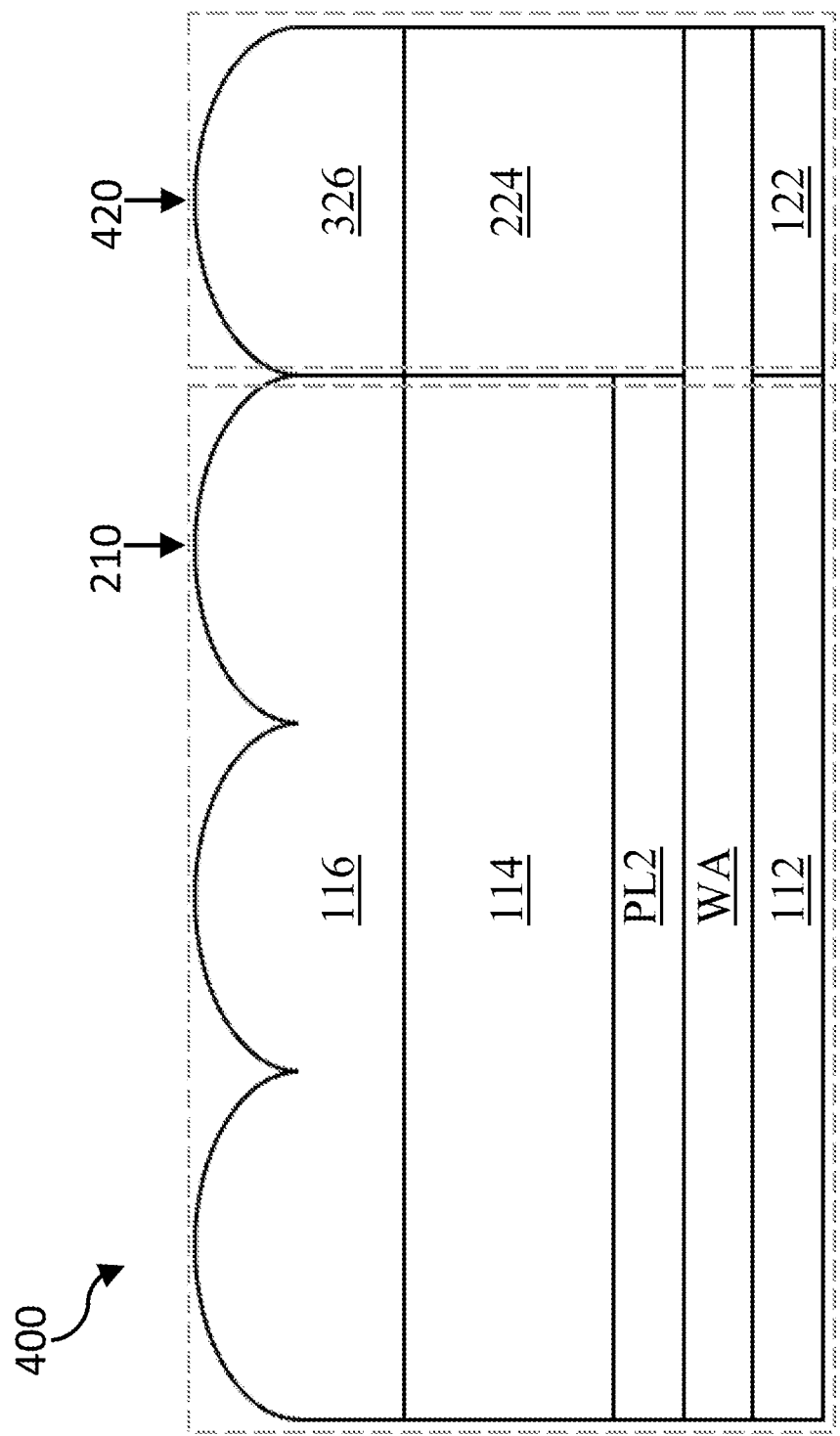
FIG. 4 is a cross-sectional view of an image sensor according to a fourth embodiment of the present invention.

FIG. 4 is a cross-sectional view of an image sensor 400 according to a fourth embodiment of the present invention. The image sensor 400 includes the visible light receiving portion 210 and an infrared receiving portion 420, in which the visible light receiving portion 210 includes the planarization layer PL2 and the infrared receiving portion 420 includes the infrared pass filter 224 and the infrared pass filter ball layer 326. The structure of the image sensor 400 is similar to the structure of the image sensor 300 except that the planarization layer PL2 is only located in the visible light receiving portion 210. It is noted that a sum of a thickness of the color filter 114 and a thickness of the planarization layer PL2 is substantially equal to a thickness of the infrared pass filter 224 in this embodiment. Similar to the image sensor 300, the infrared received by the image sensor 400 has a better intensity to meet a user's demand.

Figure 5:
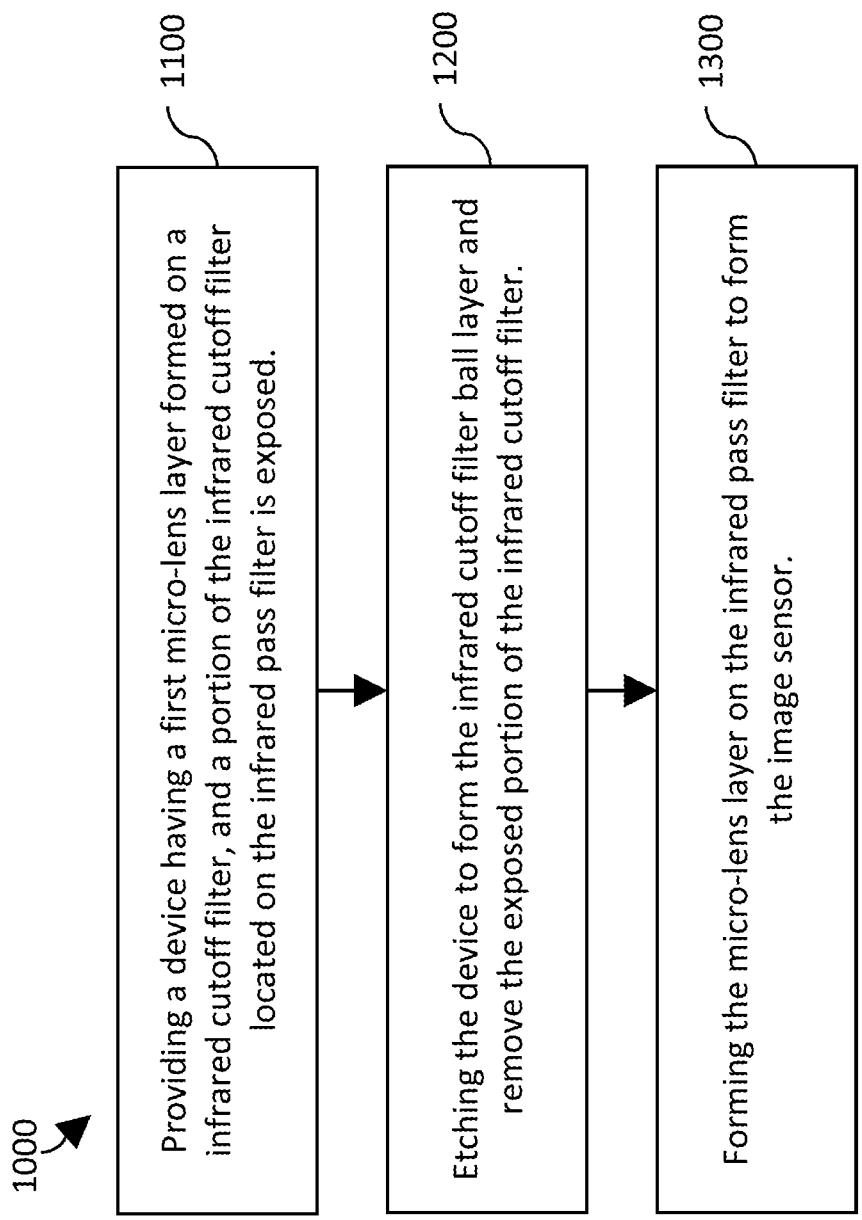
FIG. 5 is a flow chart showing a method for forming the image sensor according to the first embodiment of the present invention.
Figure 6A:
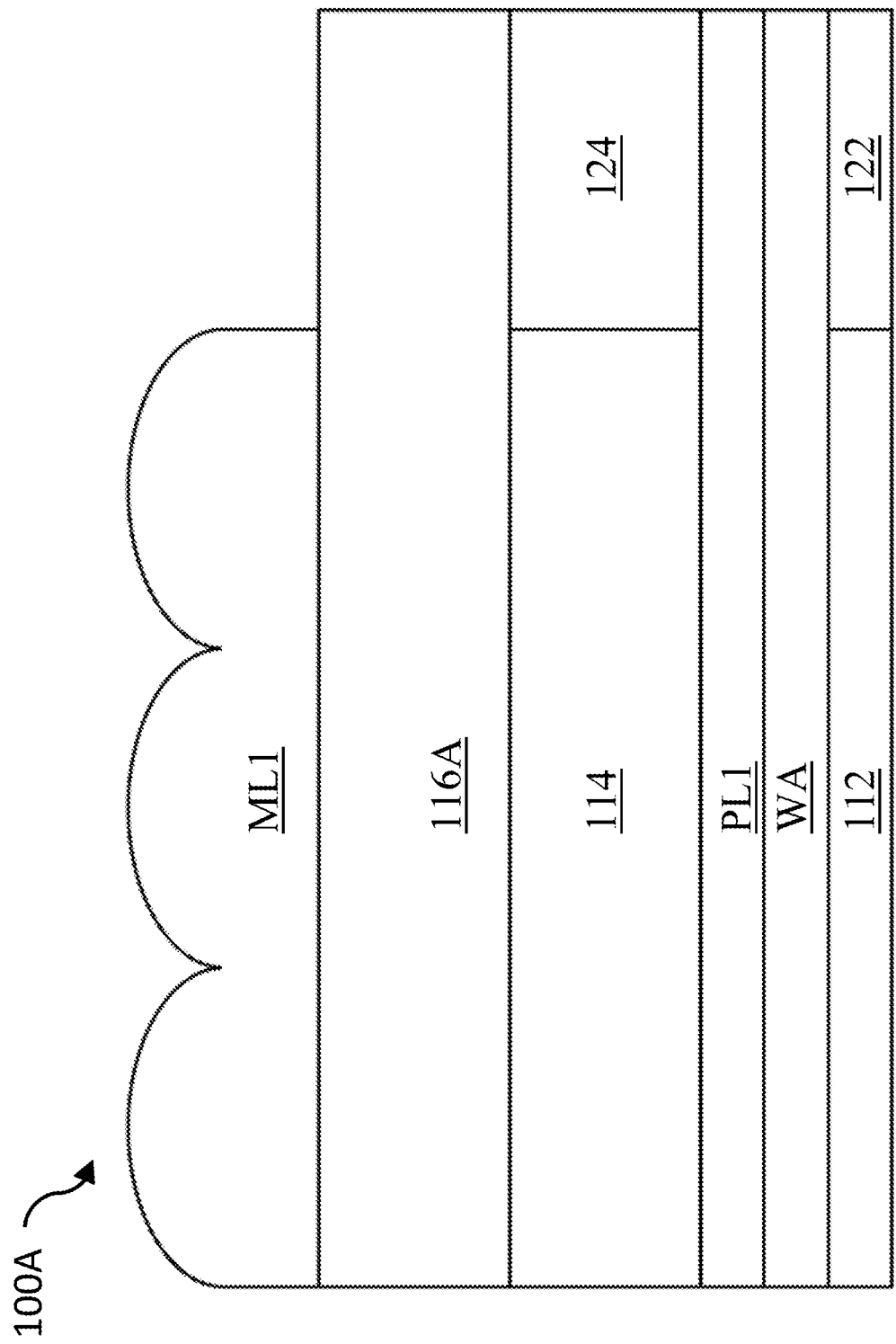
FIGS. 6a-6d are cross-sectional views of the image sensor corresponding to the steps of the method for forming the image sensor in accordance with the first embodiment of the present invention.

Referring to FIG. 5 and FIGS. 6a-6d, FIG. 5 is a flow chart showing a method 1000 for forming the image sensor 100 according to the first embodiment of the present invention, and FIGS. 6a-6d are cross-sectional views of the image sensor 100 respectively corresponding to the steps 1100-1300 of the method 1000 for forming the image sensor 100 in accordance with the first embodiment of the present invention. The method 1000 starts from step 1100. In step 1100, a device 100A is provided as shown in FIG. 6a. The device 100A includes the visible light sensing layer 112, the infrared sensing layer 122, the wafer WA, the planarization layer PL1, the color filter 114, the infrared pass filter 124, an infrared cutoff filter 116A, and a first micro-lens layer ML1, in which the first micro-lens layer ML1 is formed on the infrared cutoff filter 116A to be used as a mask for the infrared cutoff filter 116A, and a portion of the infrared cutoff filter 116A located on the infrared pass filter 124 is exposed. It is noted that the first micro-lens layer ML1 is similar to the micro-lens layer ML.

Figure 6B:
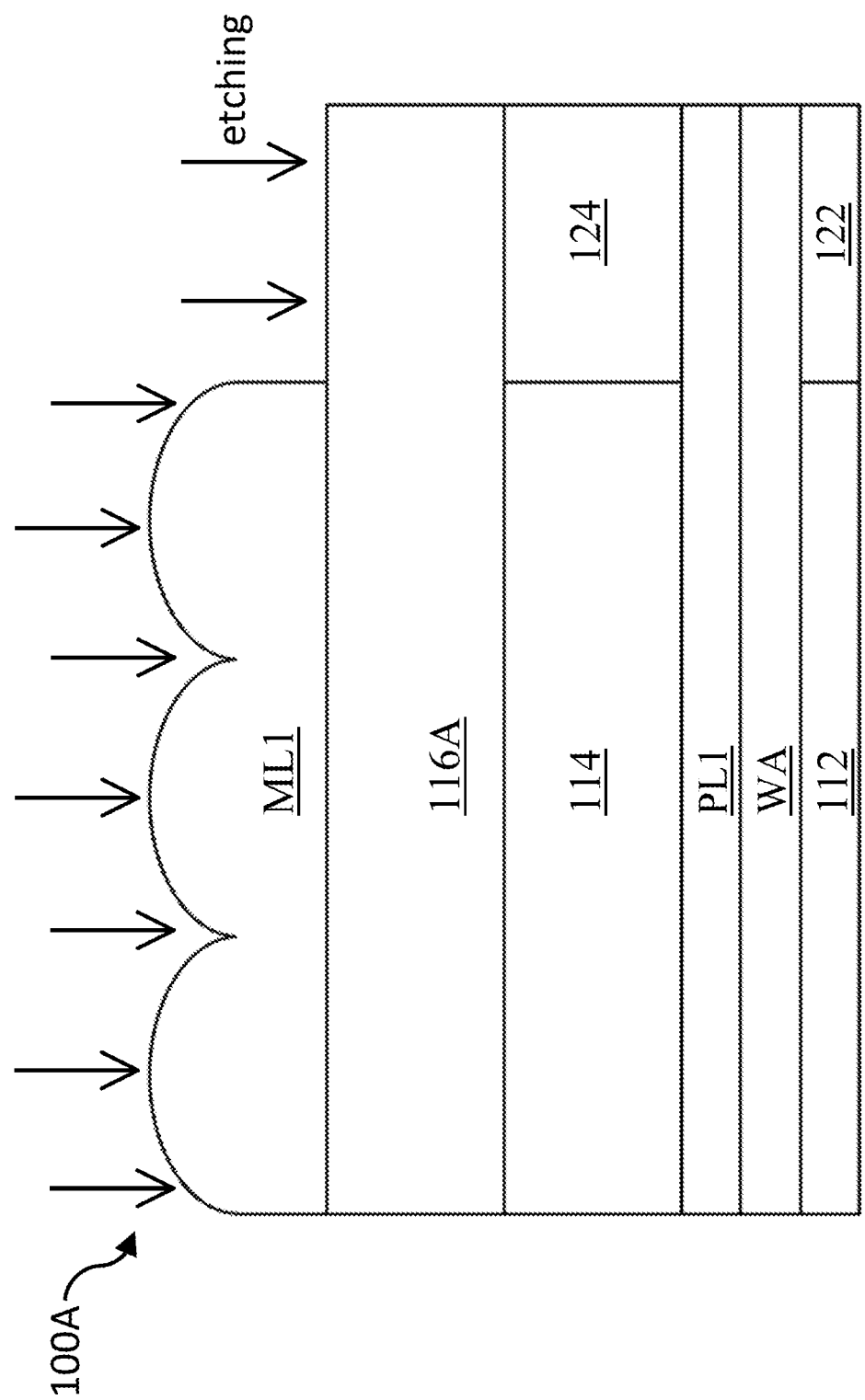
Figure 6C:
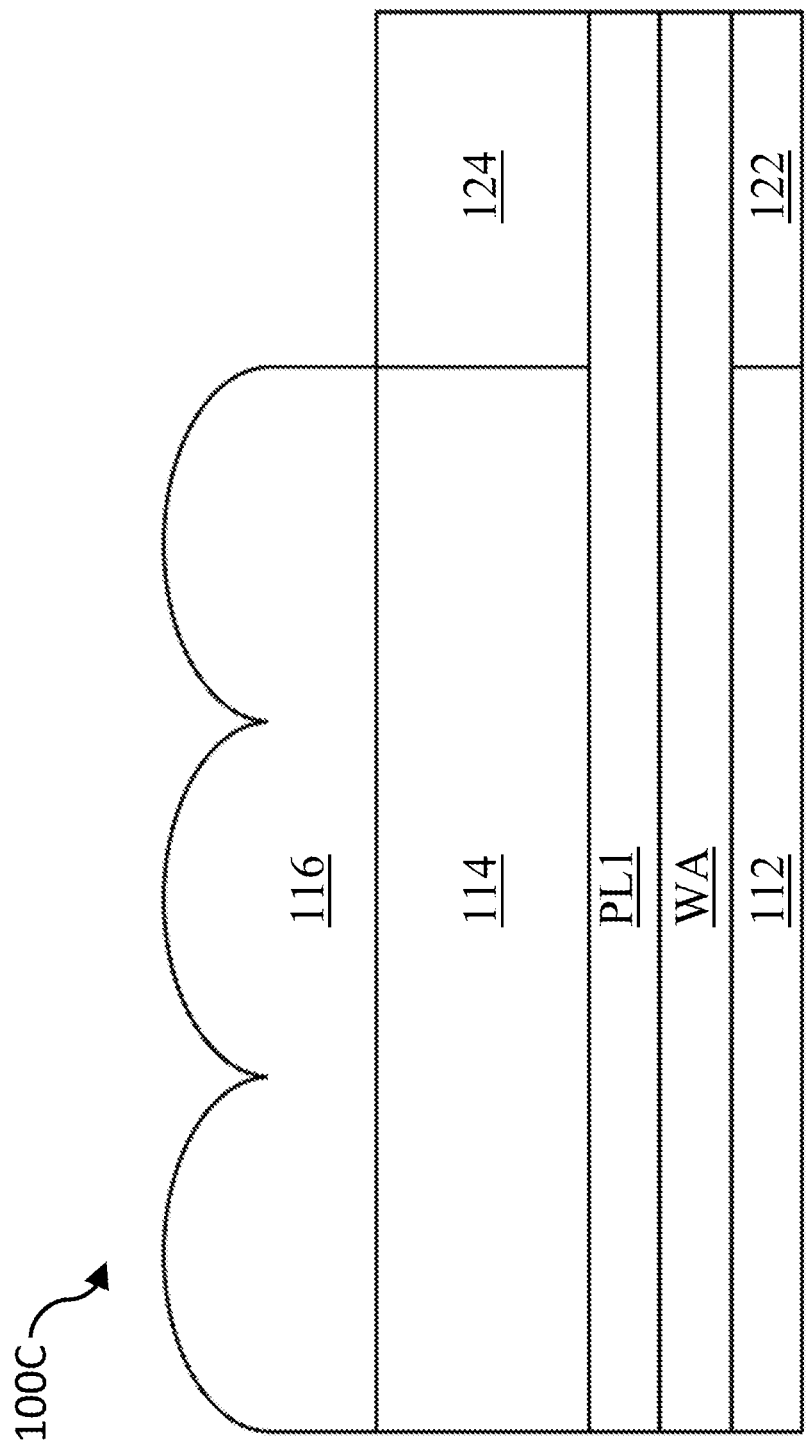

As shown in FIG. 6b, in step 1200 of the method 1000, the device 100A is etched by an etching process. Specifically, the first micro-lens layer ML1 and the exposed portion of the infrared cutoff filter 116A are etched to enable the remained infrared cutoff filter 116A has a top surface substantially the same as that of the first micro-lens layer ML1, thereby forming the infrared cutoff filter ball layer 116 of the device 100C as shown in FIG. 6c. It is noted that the exposed portion of the infrared cutoff filter 116A is removed in step 1200.

Figure 6D:
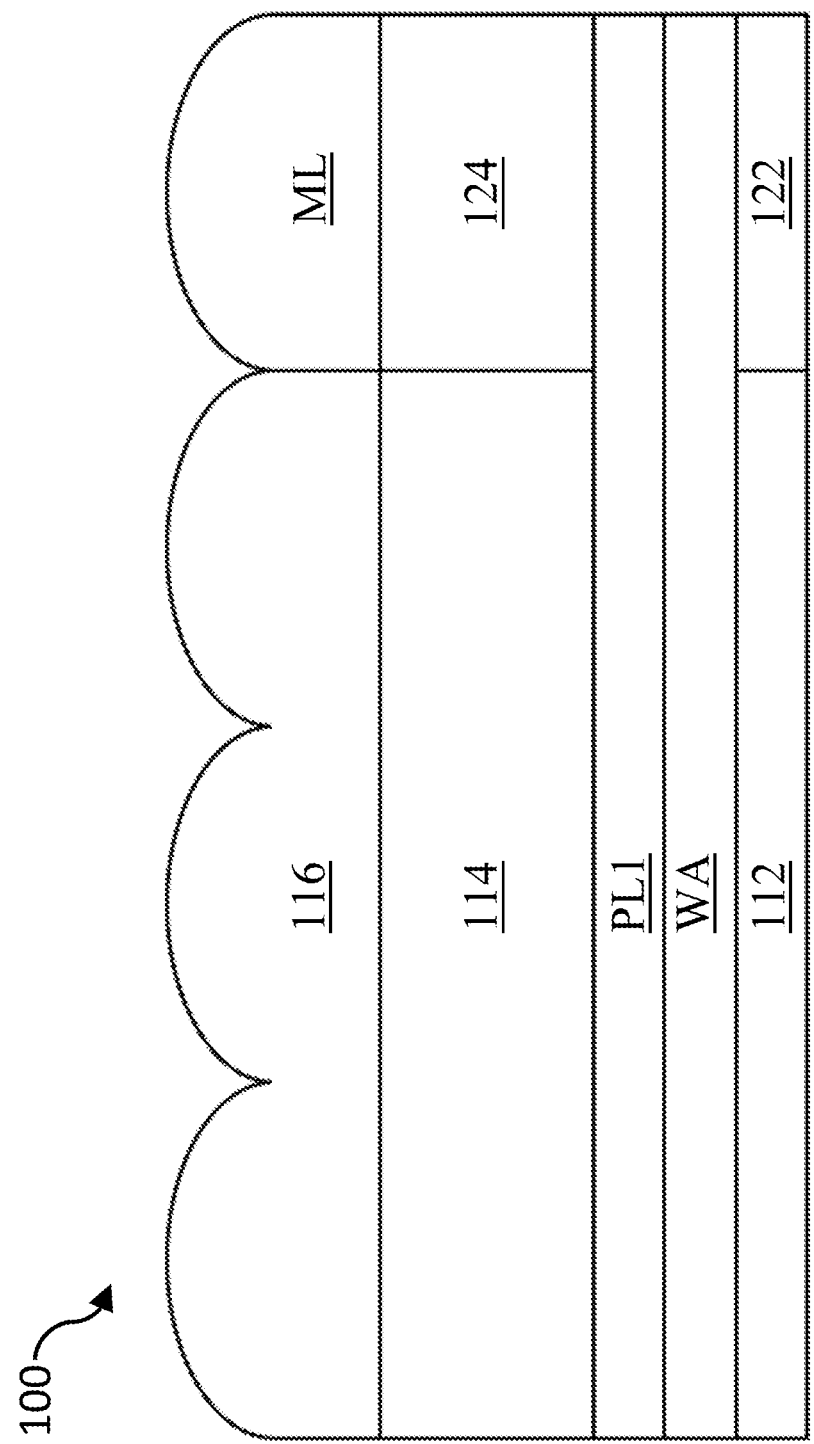

As shown in FIG. 6d, in step 1300 of the method 1000, the micro-lens layer ML is formed on the infrared pass filter 124, thereby forming the image sensor 100.

Figure 7:
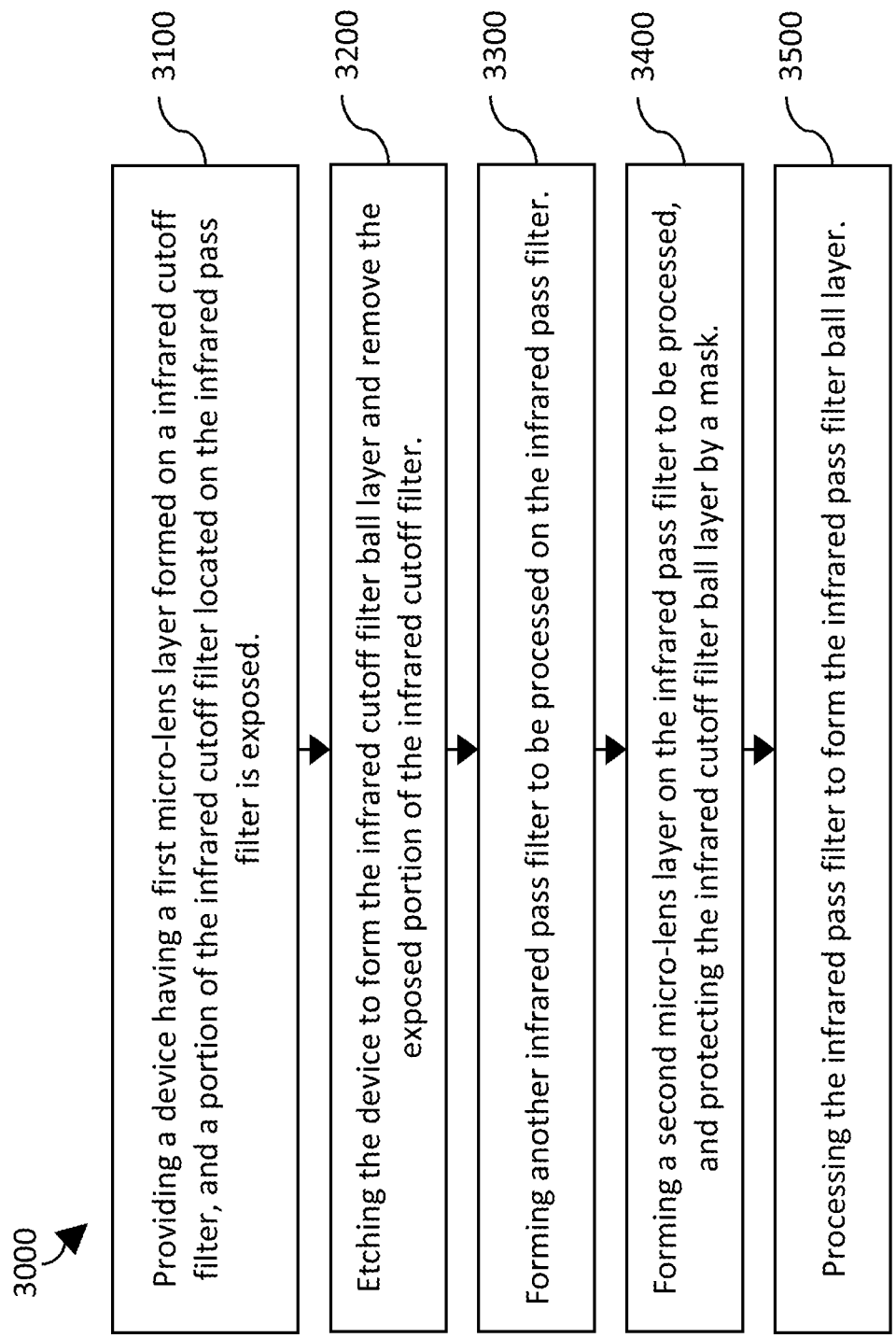
FIG. 7 is a flow chart showing a method for forming the image sensor according to the third embodiment of the present invention.
Figure 8A:
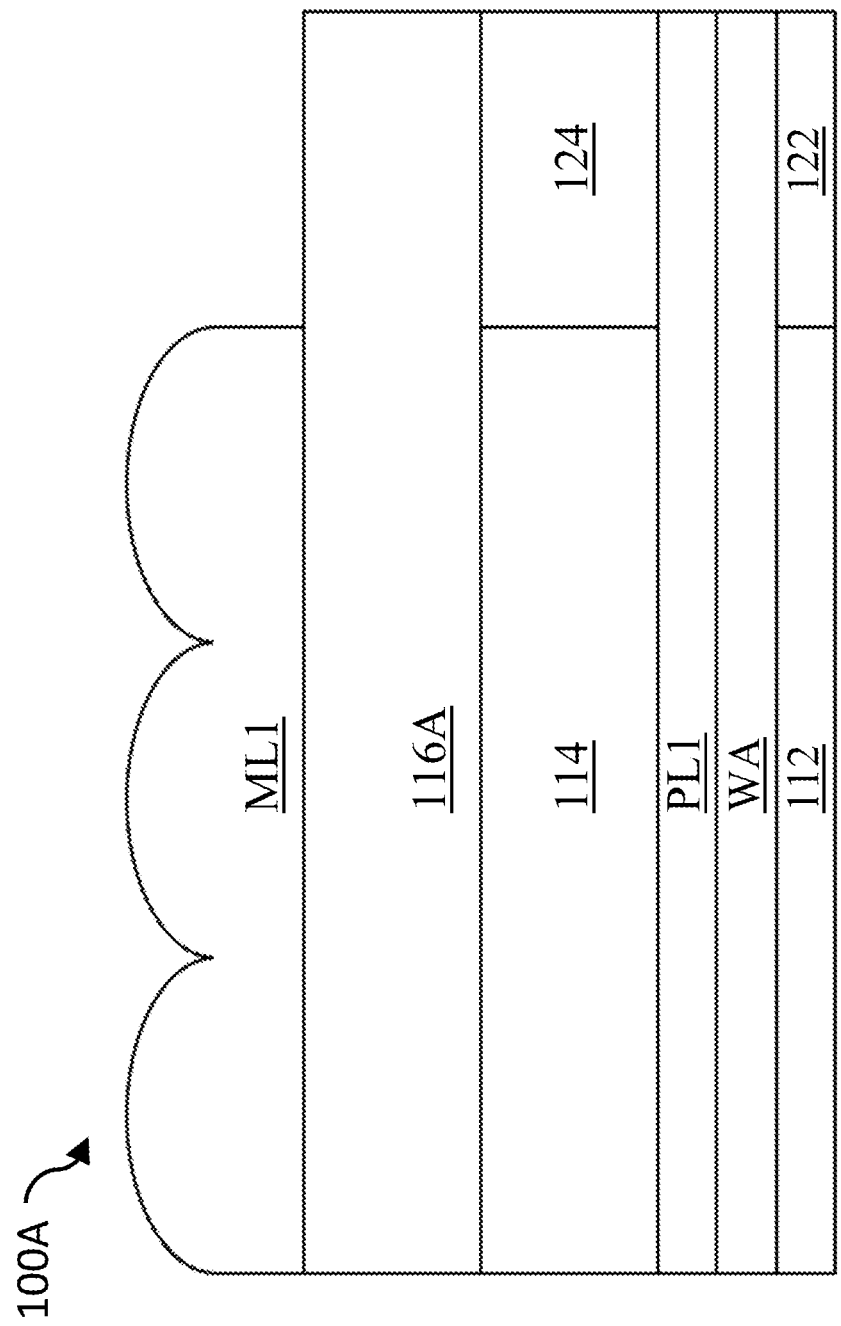
Figure 8B:
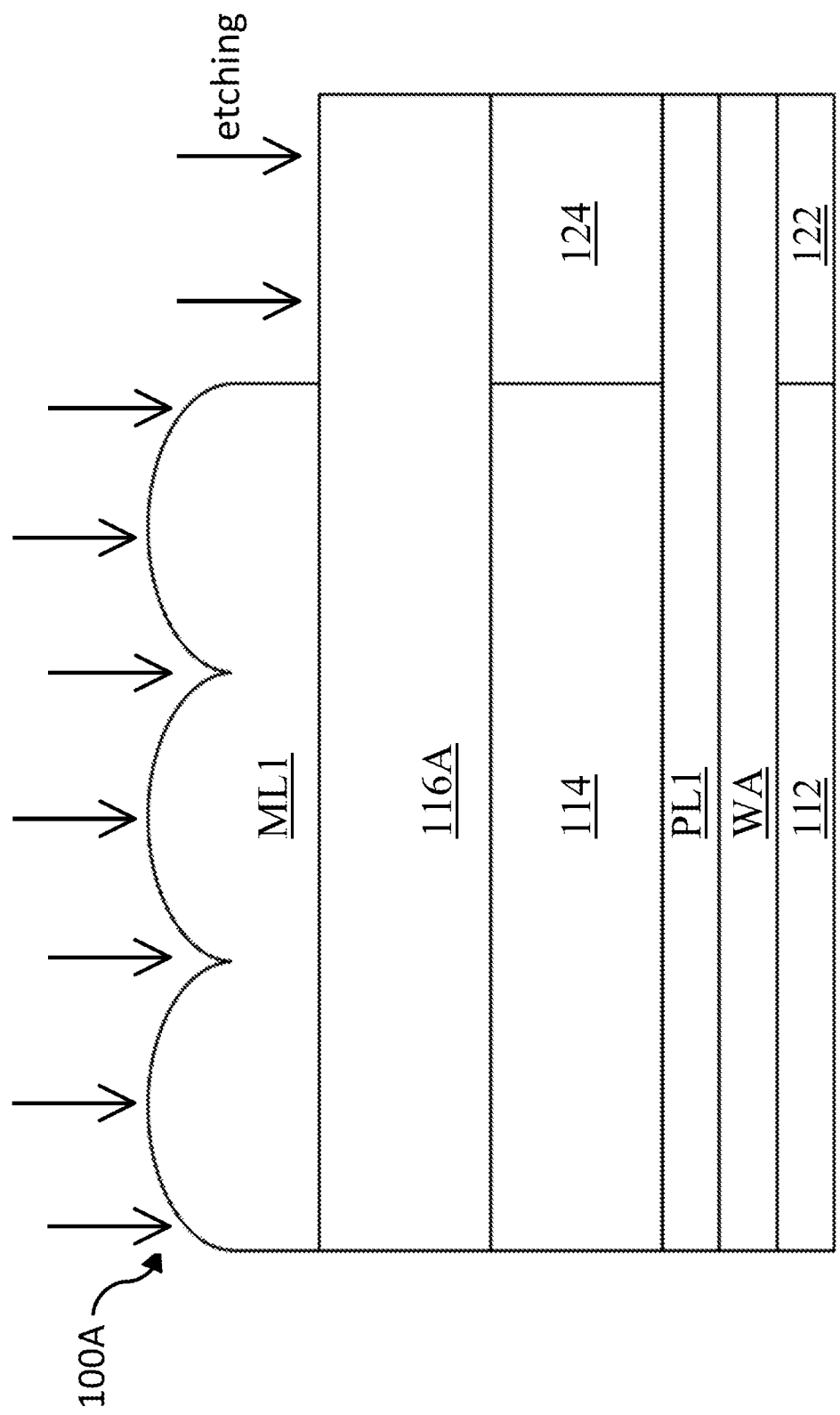

Referring to FIG. 7 and FIGS. 8a-8g, FIG. 7 is a flow chart showing a method 3000 for forming the image sensor 300 according to the third embodiment of the present invention, and FIGS. 8a-8f are cross-sectional views of the image sensor 300 respectively corresponding to the steps 3100-3500 of the method 3000 for forming the image sensor 300 in accordance with the third embodiment of the present invention. The steps 3100-3200 of the method 3000 as shown in FIG. 7 are the same as the steps 1100-1200 of the method 1000 as shown in FIG. 5 respectively, and the cross-sectional views in FIGS. 8a-8c are the same as the cross-sectional views in FIGS. 6a-6c respectively. Thus, the description of them is not described again herein.

Figure 8D:
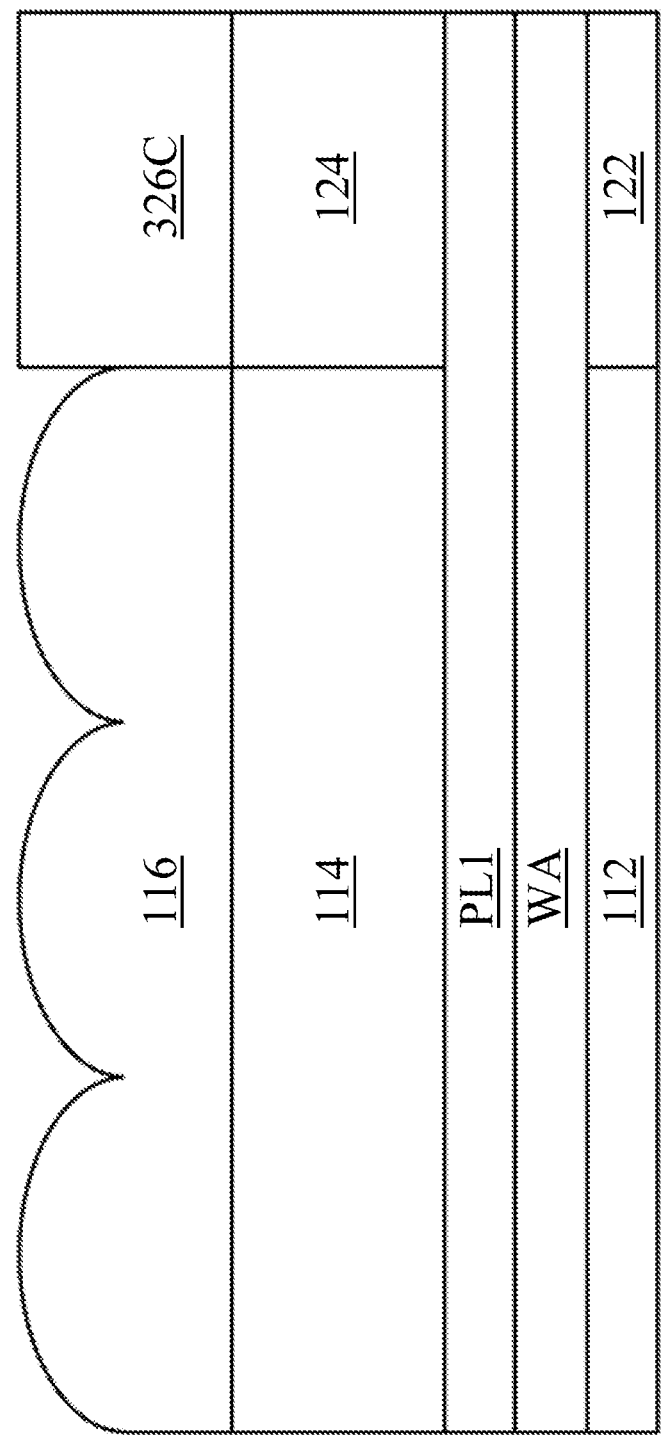

In step 3300 of the method 3000, another infrared pass filter 326C to be processed in subsequent steps is formed on the infrared pass filter 124, as shown in FIG. 8d. It is noted that the infrared pass filter 326C is similar to the infrared pass filter 124.

Figure 8E:
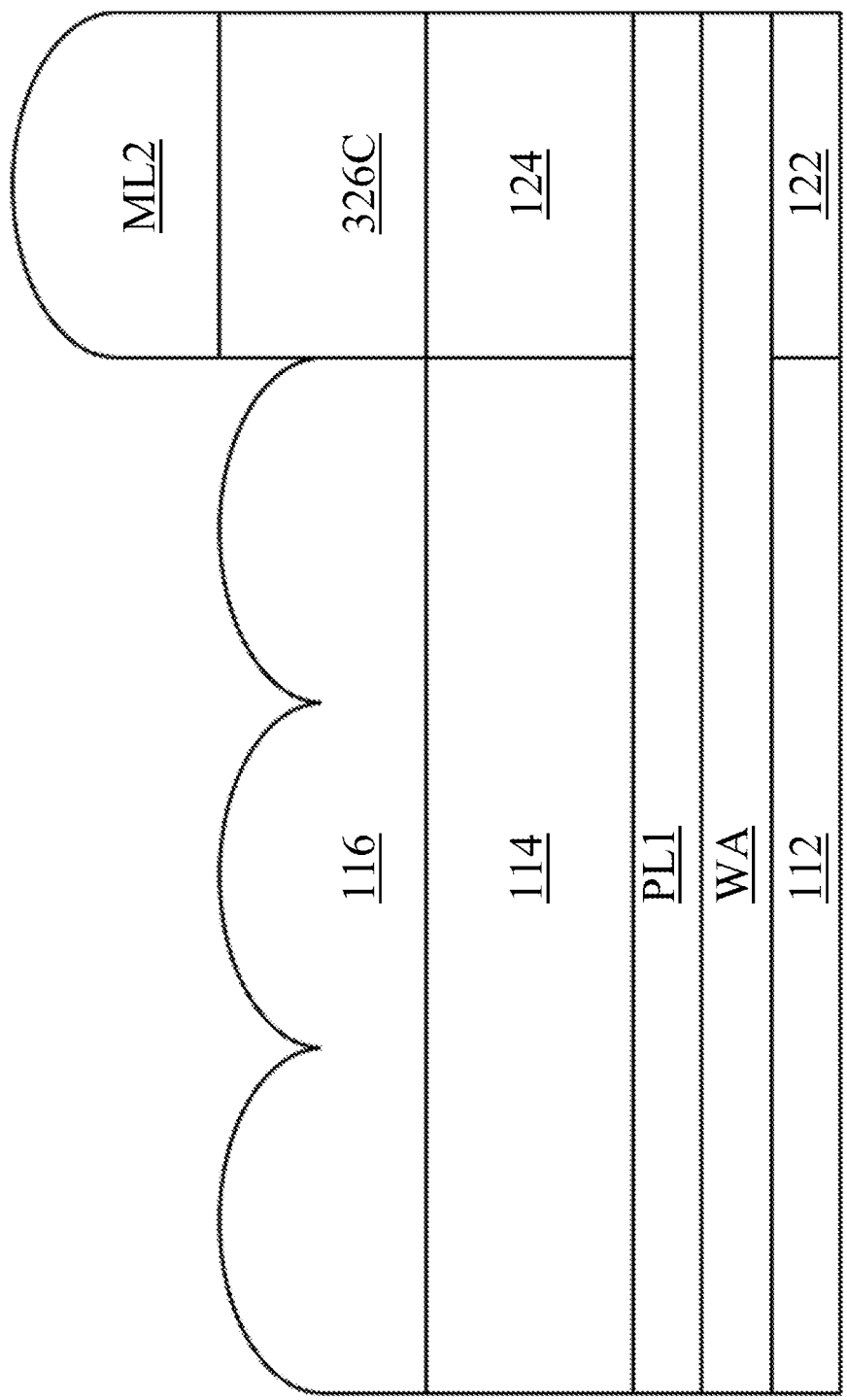

In step 3400 of the method 3000, a second micro-lens layer ML2 is formed on the infrared pass filter 326C to be processed, as shown in FIG. 8e. In addition, the infrared cutoff filter ball layer 116 is protected by another mask (not shown). It is noted that the second micro-lens layer ML2 is similar to the micro-lens layer ML.

Figure 8F:
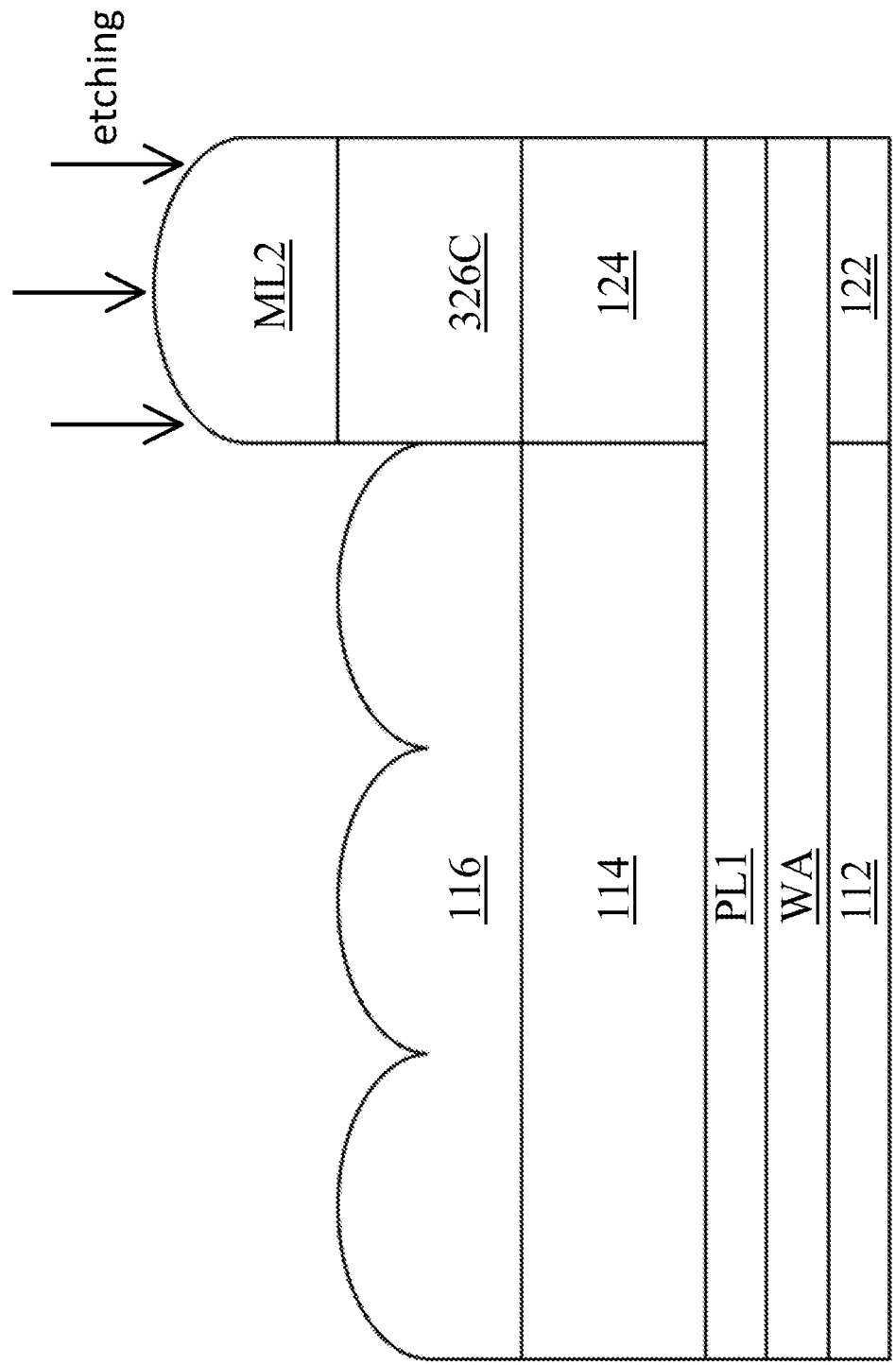

As shown in FIG. 8f, in step 3500 of the method 3000, the infrared pass filter 326C is processed. Specifically, the second micro-lens layer ML2 is etched to enable the infrared pass filter 326C has a top surface substantially the same as that of the second micro-lens layer ML2, thereby forming the infrared pass filter ball layer 326 as shown in FIG. 8g. It is noted that the infrared cutoff filter ball layer 116 is unaffected in step 3500 due to the protection by another mask (not shown). Thus, the image sensor 300 is formed.

From the above description, the structure of the image sensor of the present invention may effectively improve the intensity of the infrared received by the image sensor to meet a user's demand, thereby reducing the difficulty of follow-up analysis of the optical signal (for example image signal) on other instruments.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An image sensor, comprising:
a visible light receiving portion configured to receive a visible light, wherein the visible light receiving portion comprises a visible light photodiode, a color filter disposed on the visible light photodiode, and an infrared cutoff filter hemisphere layer configured to focus the visible light and to cutoff infrared, wherein an upper surface of the infrared cutoff filter hemisphere layer is convex and is a curved surface, wherein a bottom surface of the infrared cutoff filter hemisphere layer is a flat surface, wherein the infrared cutoff filter hemisphere layer further comprises straight sidewalls, wherein the infrared cutoff filter hemisphere layer is a monolithic structure, wherein the infrared cutoff filter hemisphere layer is an etched layer, wherein the infrared cutoff filter hemisphere layer is disposed on the color filter, and the visible light is received by the visible light photodiode after passing through the infrared cutoff filter hemisphere layer and the color filter;
an infrared receiving portion configured to receive the infrared, wherein the infrared receiving portion comprises a micro-lens layer configured to focus the infrared, wherein the micro-lens layer further comprises straight sidewalls; and
a planarization layer configured to provide a flat surface on which the color filter is disposed, wherein the planarization layer has a lower surface opposite to the flat surface, the lower surface being closer to the visible light photodiode than the flat surface, and wherein the color filter is disposed directly on the flat surface of the planarization layer, wherein the planarization layer is located in the visible light receiving portion and outside the infrared receiving portion.

2. The image sensor of claim 1, wherein the infrared receiving portion further comprises:
an infrared photodiode; and
an infrared pass filter disposed on the infrared photodiode;
wherein the micro-lens layer is disposed on the infrared pass filter, and the infrared is received by the infrared photodiode after passing through the micro-lens layer and the infrared pass filter.

3. The image sensor of claim 2, further comprising a wafer located on the visible light photodiode and the infrared photodiode, wherein a first portion of the wafer is located in the visible light receiving portion and a second portion of the wafer is located in the infrared receiving portion.

4. The image sensor of claim 3, wherein the first portion of the wafer is located between the color filter and the visible light photodiode, and the second portion of the wafer is located between the infrared pass filter and the infrared photodiode.

5. The image sensor of claim 1, wherein the color filter comprises a red color filter unit, a green color filter unit, and a blue color filter unit.

6. The image sensor of claim 1, wherein the planarization layer is located in the visible light receiving portion and the infrared receiving portion.

7. The image sensor of claim 1, wherein the planarization layer is located in the visible light receiving portion.

8. The image sensor of claim 1, wherein the planarization layer is located in the visible light receiving portion and the infrared receiving portion.

9. The image sensor of claim 1, wherein the infrared receiving portion further comprises:
an infrared photodiode; and
an infrared pass filter disposed on the infrared photodiode;
wherein the micro-lens layer is disposed on the infrared pass filter, and the infrared is received by the infrared photodiode after passing through the micro-lens layer and the infrared pass filter.

10. The image sensor of claim 9, wherein a sum of a thickness of the color filter and a thickness of the planarization layer is substantially equal to a thickness of the infrared pass filter.

11. An image sensor, comprising:
- a visible light receiving portion configured to receive a visible light, wherein the visible light receiving portion comprises a visible light photodiode, a color filter disposed on the visible light photodiode, and an infrared cutoff filter hemisphere layer configured to focus the visible light and to cutoff infrared, wherein an upper surface of the infrared cutoff filter hemisphere layer is convex and is a curved surface, wherein a bottom surface of the infrared cutoff filter hemisphere layer is a flat surface, wherein the infrared cutoff filter hemisphere layer further comprises straight sidewalls, wherein the infrared cutoff filter hemisphere layer is a monolithic structure, wherein the infrared cutoff filter hemisphere layer is an etched layer, wherein the infrared cutoff filter hemisphere layer is disposed on the color filter and the visible light is received by the visible light photodiode after passing through the infrared cutoff filter hemisphere layer and the color filter;
- an infrared receiving portion configured to receive the infrared, wherein the infrared receiving portion comprises an infrared pass filter hemisphere layer configured to focus the infrared and to cutoff the visible light, wherein an upper surface of the infrared pass filter hemisphere layer is convex and is a curved surface, wherein a bottom surface of the infrared pass filter hemisphere layer is a flat surface, wherein the infrared pass filter hemisphere layer further comprises straight sidewalls, wherein the infrared pass filter hemisphere layer is a monolithic structure, wherein the infrared pass filter hemisphere layer is an etched layer, and
- a planarization layer configured to provide a flat surface on which the color filter is disposed, wherein the planarization layer has a lower surface opposite to the flat surface, the lower surface being closer to the visible light photodiode than the flat surface, and wherein the color filter is disposed directly on the flat surface of the planarization layer, wherein the planaraization layer is located in the visible light receiving portion and outside the infrared receiving portion.

12. The image sensor of claim 11, wherein the infrared receiving portion further comprises:
- an infrared photodiode; and
- an infrared pass filter disposed on the infrared photodiode;
- wherein the infrared pass filter hemisphere layer is disposed on the infrared pass filter, and the infrared is received by the infrared photodiode after passing through the infrared pass filter hemisphere layer and the infrared pass filter.

13. The image sensor of claim 12, further comprising a wafer located on the visible light photodiode and the infrared photodiode, wherein a first portion of the wafer is located in the visible light receiving portion and a second portion of the wafer is located in the infrared receiving portion.

14. The image sensor of claim 13, wherein the first portion of the wafer is located between the color filter and the visible light photodiode, and the second portion of the wafer is located between the infrared pass filter and the infrared photodiode.

15. The image sensor of claim 11, wherein the color filter comprises a red color filter unit, a green color filter unit, and a blue color filter unit.

16. The image sensor of claim 11, wherein the planarization layer is located in the visible light receiving portion and the infrared receiving portion.

17. The image sensor of claim 11, wherein the planarization layer is located in the visible light receiving portion.

\* \* \* \* \*